United States Patent
Guterman et al.

(10) Patent No.: US 7,747,927 B2
(45) Date of Patent: *Jun. 29, 2010

(54) METHOD FOR ADAPTING A MEMORY SYSTEM TO OPERATE WITH A LEGACY HOST ORIGINALLY DESIGNED TO OPERATE WITH A DIFFERENT MEMORY SYSTEM

(75) Inventors: Daniel C. Guterman, Fremont, CA (US); Yoram Cedar, Cupertino, CA (US); Charles Schroter, Los Gatos, CA (US); Milton Lourenco Barrocas, San Jose, CA (US); Carlos Gonzalez, Los Gatos, CA (US); Kevin M. Conley, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 404 days.

This patent is subject to a terminal disclaimer.

(21) Appl. No.: 11/285,992

(22) Filed: Nov. 22, 2005

(65) Prior Publication Data

US 2007/0136639 A1    Jun. 14, 2007

(51) Int. Cl.
  *G11C 29/00*  (2006.01)
  *H03M 13/00*  (2006.01)
(52) U.S. Cl. .................. 714/768; 714/774
(58) Field of Classification Search .......... 714/7, 714/718, 768, 752, 751, 774, 746, 763, 799; 365/200, 201; 711/140, 170
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |

(Continued)

FOREIGN PATENT DOCUMENTS

WO    WO 00/67132 A    11/2000

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Phung M Chung
(74) *Attorney, Agent, or Firm*—Davis Wright Tremaine LLP

(57) ABSTRACT

A non-volatile memory device is provided with a controller and includes method that controls memory operations and to emulate the memory and communication characteristics of a legacy memory device. In this way, the memory device is compatible with a host that was originally designed to operate the legacy memory device. In particular, the controller performs the emulation to the host taking into account differences such as multibit memory, error correction requirement, memory support of overwrites, and erasable block sizes.

5 Claims, 9 Drawing Sheets

U.S. PATENT DOCUMENTS

| | | | |
|---|---|---|---|
| 5,887,145 A * | 3/1999 | Harari et al. | 710/301 |
| 5,890,207 A * | 3/1999 | Sne et al. | 711/113 |
| 5,890,219 A * | 3/1999 | Scaringella et al. | 711/162 |
| 5,903,495 A | 5/1999 | Takeuchi et al. | |
| 6,011,725 A | 1/2000 | Eitan | |
| 6,046,935 A | 4/2000 | Takeuchi et al. | |
| 6,047,361 A * | 4/2000 | Ingenio et al. | 711/167 |
| 6,216,247 B1 | 4/2001 | Creta et al. | |
| 6,222,762 B1 | 4/2001 | Guterman et al. | |
| 6,233,717 B1 * | 5/2001 | Choi | 714/805 |
| 6,530,007 B2 * | 3/2003 | Olarig et al. | 711/167 |
| 6,901,494 B2 * | 5/2005 | Zumkehr et al. | 711/167 |
| 2003/0097520 A1 | 5/2003 | Lai et al. | |
| 2004/0049627 A1 | 3/2004 | Piau et al. | |
| 2005/0144358 A1 | 6/2005 | Conley et al. | |
| 2005/0144360 A1 | 6/2005 | Bennett et al. | |
| 2005/0195653 A1 | 9/2005 | Conley et al. | |
| 2007/0118713 A1 * | 5/2007 | Guterman et al. | 711/170 |

FOREIGN PATENT DOCUMENTS

| | | |
|---|---|---|
| WO | WO 02/05102 A | 1/2002 |

OTHER PUBLICATIONS

USPTO, "Office Action," mailed in related U.S. Appl. No. 11/286,100 on Sep. 21, 2007, 13 pages.

EPO/ISA, "Notification of Transmittal of the International Search Report and the Written Opinion of the International Searching Authority, or the Declaration," corresponding International Patent Application No. PCT/US2006/060932, mailed on May 9, 2008, 13 pages.

USPTO, "Office Action," mailed in related U.S. Appl. No. 11/286,100 on Nov. 7, 2008, 15 pages.

Taiwanese Patent Office, "Office Action and Search Report," corresponding Taiwanese Patent Application No. 095143261, mailed on Mar. 13, 2009, 8 pages.

USPTO, "Office Action," mailed in related U.S. Appl. No. 11/286,100 on Aug. 6, 2009, 17 pages.

USPTO, "Office Action," mailed in related U.S. Appl. No. 11/286,100 on Mar. 12, 2008, 9 pages.

USPTO, "Notice of Allowance and Fee(s) Due," mailed in related U.S. Appl. No. 11/286,100 on Feb. 4, 2010, 19 pages.

* cited by examiner

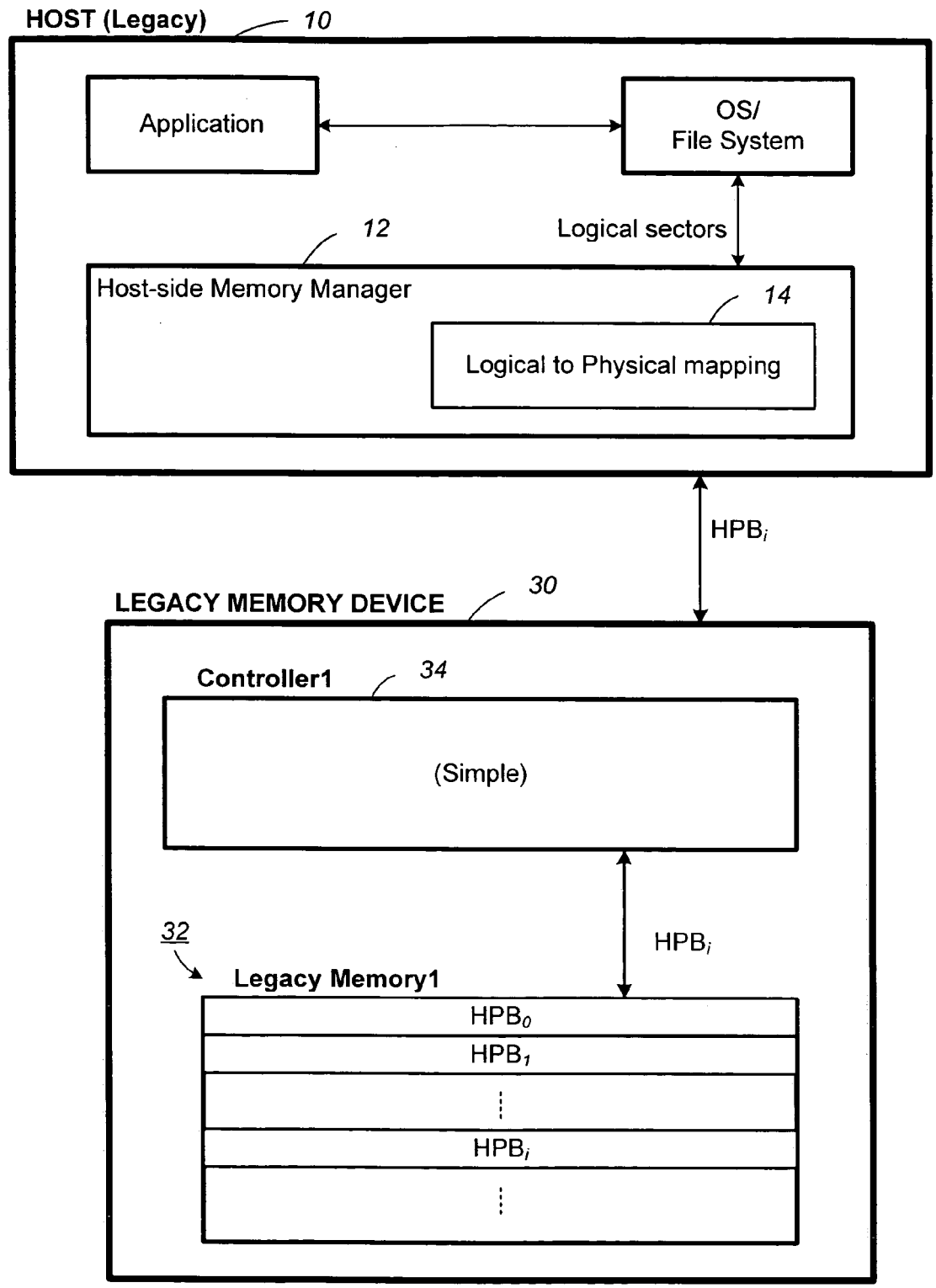
FIG. 5A *(Legacy)*

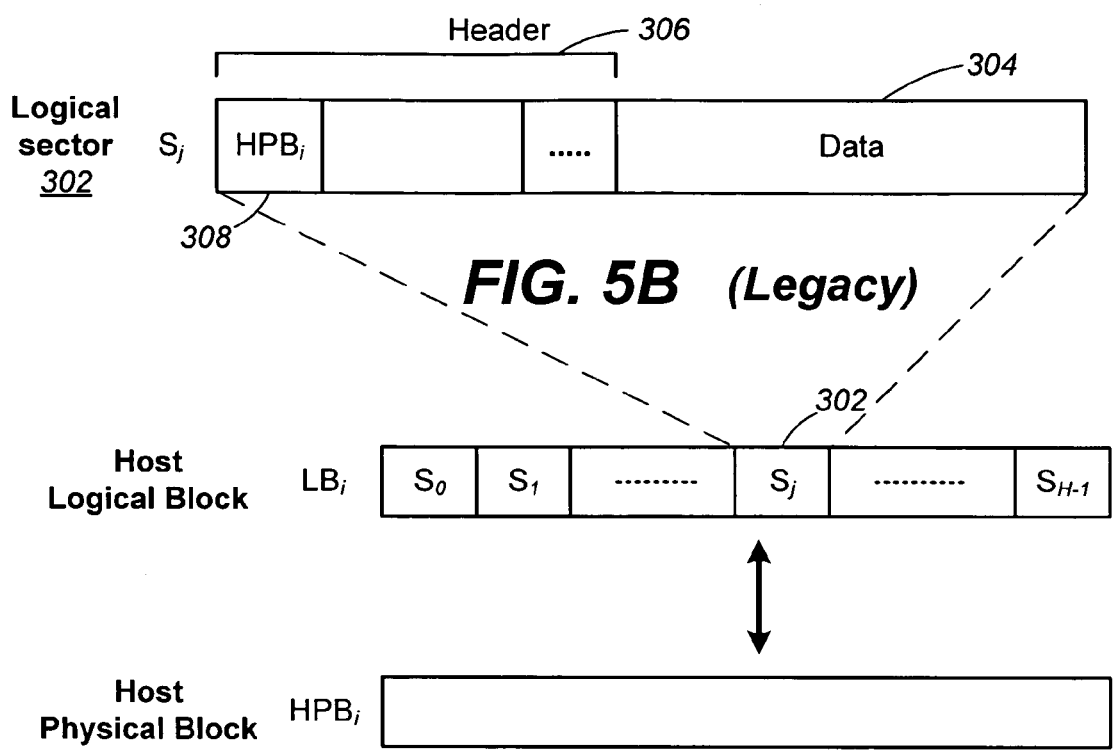
FIG. 5B *(Legacy)*
FIG. 5C *(Legacy)*
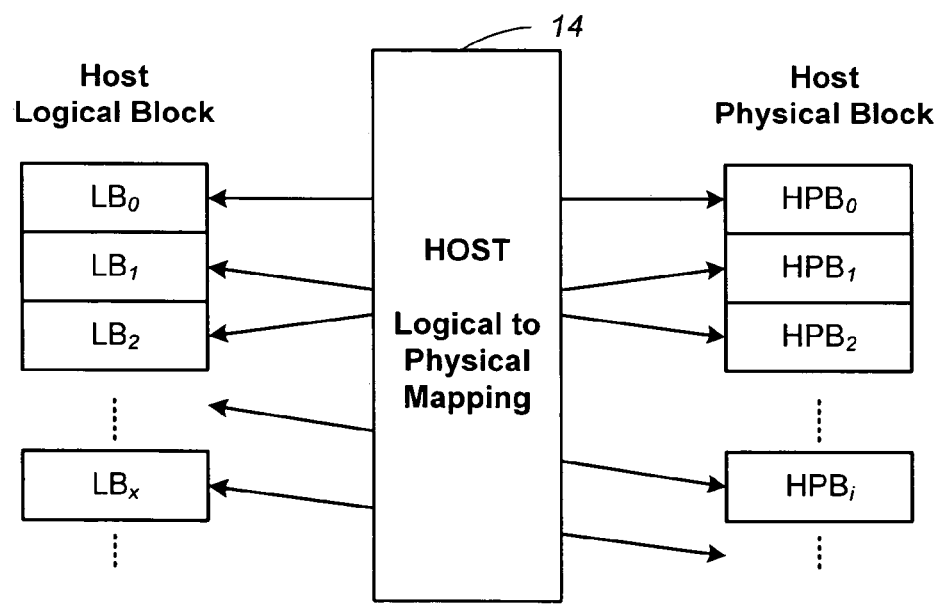
FIG. 5D *(Legacy)*

METHOD FOR ADAPTING A MEMORY SYSTEM TO OPERATE WITH A LEGACY HOST ORIGINALLY DESIGNED TO OPERATE WITH A DIFFERENT MEMORY SYSTEM

CROSS-REFERENCE TO RELATED APPLICATION

This is related to U.S. application Ser. No. 11/286,100 filed concurrently on Nov. 22, 2005, by Daniel C. Guterman et al., entitled "Memory System for Legacy Hosts."

FIELD OF THE INVENTION

This invention relates generally to non-volatile semiconductor memory and specifically to those backward compatible to legacy hosts that were originally designed to work with two-state and smaller block size memory.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost compared to magnetic disk drives, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memories, both embedded and in the form of a removable card, are ideally suited in the mobile and handheld environment because of their small size, low power consumption, high speed and high reliability attributes.

Flash EEPROM is similar to EEPROM (electrically erasable and programmable read-only memory) in that it is a non-volatile memory that can be erased and have new data written or "programmed" into its memory cells. Both typically utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeably with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

The earlier generations of flash memory are characterized by lower memory integration, each memory element (e.g., cell) storing one bit of data, and having an architecture with a smaller erase block size. These legacy memory devices require relatively simple memory management and data manipulation. When embodied as a removable memory card, these legacy memory devices are typically controlled by a simple memory controller. To save cost, the simple memory controller is typically implemented as software drivers on a legacy host system designed to operate with a particular legacy memory device. The interface between the legacy host system and its removable memory device is as basic as the simple memory controller requires Each generation of flash memory sees an increase in memory capacity and higher performance. The increase in memory capacity is possible with increased large-scale integration in semi-conductor technology and also with the implementation of multistate memory where each memory element stores more than one bit of data.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must typically be written to an erased memory location. If data of a certain logical address from a host is to be updated, one way is to rewrite the update data in the same physical memory location. That is, the logical to physical address mapping is unchanged. However, this will mean the entire erase block containing that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Thus, the granularity of read, program and erase can change with different generations of memory technology. Similarly, the memory may also progress from 2-state to multistate, requiring different read and program techniques as well as more sophisticated error correction schemes. All in all, a later generation memory may not be compatible with a legacy host designed to operate with an earlier generation memory.

On the other hand, there is a large body of existing electronic and computing devices that were designed to work with earlier generations of memory devices. These legacy hosts typically work with removable memory cards that contain an array of memory cells with a simple memory interface. The memory cells are organized into erasable block of relatively small size. These legacy memory devices, unlike those of the more recent generation, do not come with their own intelligent memory controller. Thus, the small amount of memory block management required is performed on the host side by means of the host processor. For this reason, these legacy hosts are designed to work only with a specific generation of memory device and their interfaces are customized to the hardware characteristics of a given memory system.

It would be desirable to produce memory devices for these legacy hosts using the latest memory technology in spite of the difference in memory architecture, control and operation, thereby reaping the benefit of high integration, high capacity and low cost.

SUMMARY OF INVENTION

A non-volatile memory device having a first set of memory and communication characteristics is provided with a controller whose functions include providing an interface and method that emulates a legacy memory device having a second set of memory and communication characteristics. In this way, the memory device is compatible with legacy hosts originally designed to work with the legacy memory device. The interface resolves at least one difference that exists between the first and second sets of memory and communication characteristics, the at least one difference selected from the group consisting essentially of error correction code, memory block size, number of bits stored in each memory cell and status information.

According to one aspect of the invention, a non-legacy memory device is adapted to operate with a legacy host originally designed to handle error correction for a legacy memory device which is different from that of the non-legacy memory device. This is accomplished by providing a memory controller with the non-legacy memory device to process the ECC (error correction code) appropriate for the non-legacy memory device and then compute a legacy ECC to present to the host. In this way, the error correction for the non-legacy memory device is taken care of while no modifications need be made at the host.

According to another aspect of the invention, status information that the legacy host expects to update on the header of a sector is instead maintained and updated in a table stored with the non-legacy memory device's controller. In this way, compatibility with the legacy host is maintained even when the non-legacy memory device does not support partial overwrites of previously written bytes or sectors.

Additional features and advantages of the present invention will be understood from the following description of its preferred embodiments, which description should be taken in conjunction with the accompanying drawings.

BRIEF DESCRIPTION OF THE DRAWINGS

FIG. 5A illustrates metablocks being constituted from linking of minimum erase units of different planes.

FIG. 5A illustrates the memory architecture and addressing scheme of a legacy memory device.

FIG. 5B illustrates the organization of a logical sector of the legacy memory device.

FIG. 5C illustrates a logical block of sectors as assigned by the host and allocated to a host physical block HPB in the legacy memory.

FIG. 5D illustrates the logical to physical mapping between logical blocks and host physical blocks as performed by the host.

DETAILED DESCRIPTION OF THE PREFERRED EMBODIMENTS

Legacy Host

Figure 1:
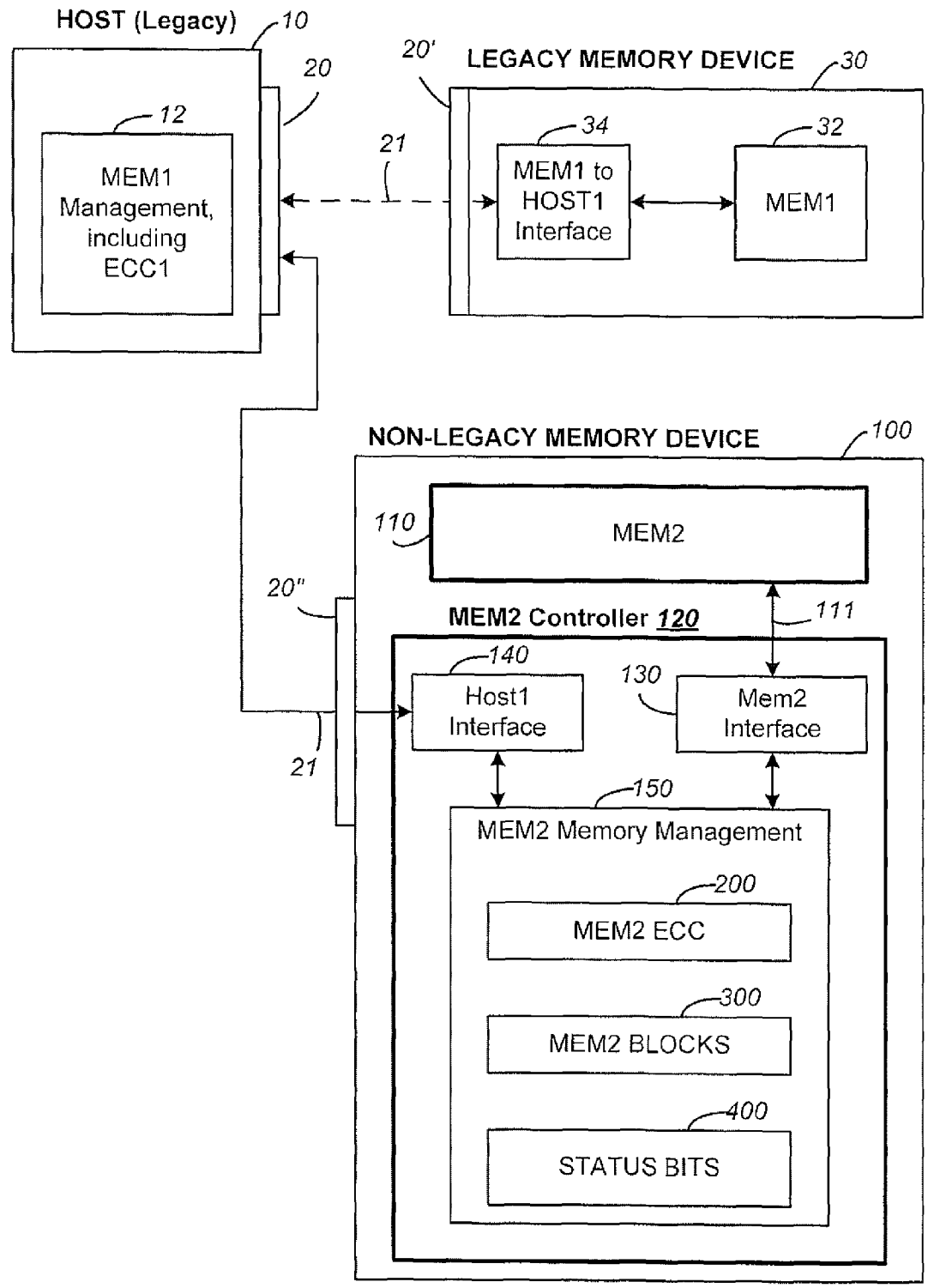
FIG. 1 illustrates schematically a non-legacy memory device adapted to operate with a legacy host originally designed to operate with a legacy memory device.

FIG. 1 illustrates schematically a legacy host originally designed to operate with a legacy memory device. The legacy host 10 has a connector 20 which, when mated to a complementary connector 20' of a legacy memory device 30, allows a set of data and control lines 21 to run from the legacy host 10 to the legacy memory device 30.

The legacy memory device 30, may be part of an embedded system in the host or is in the form of an externally removable storage device such as a memory card. It includes a memory array 32 and an interface 34 that allows it to be operated by the legacy host. The array of memory cells are organized into erasable blocks in which all memory cells within each block are erasable as a unit. In the case of legacy memory devices, the erasable block size is typically of relatively small size, such as 512 MB, corresponding to a DOS sector. Also, the memory cells are typically capable of storing one bit of data per cell. As compared to later generation memory, the legacy memory device has relatively simple memory architecture and operational requirements. Consequently, the legacy memory device typically requires only a simple memory controller to control its operations. In order to reduce the cost of the legacy memory device, the simple memory controller is partitioned into a host-side portion of the controller and a memory-side portion of the controller. Much of the intelligence is located in the host-side, leaving a minimum of functions to be performed by the memory-side portion of the controller. Thus, the memory interface 34 serves as the memory-side portion of the controller and typically provides the necessary operating voltages and in some cases, a state machine to perform simple sequential logical functions.

The legacy host 10 is designed to work with a specific legacy memory device, such as the memory device 30, since it contains a host-side portion of the controller 12 specific to the legacy memory device 30. As explained above, the legacy memory device 30, unlike those of the more recent generation, has most of its memory block management handled by the more intelligent host-side portion of controller. Economically, the intelligence is provided by the host processor and the memory controller functions are typically implemented by a set of software drivers at the host.

Thus, it can be seen that the legacy host 10 is designed to work only with a specific generation of memory device and their interfaces are customized to the hardware characteristics of the given memory device. Generally, these legacy memory devices are in the form of an integrated circuit chip and their interfaces are simply defined by the chip's pin-out specifications. Conversely, the legacy host 10 generally does not work with memory devices from a later generation and therefore can not take advantage of the lower cost and higher capacity offered by these non-legacy memory devices.

Non-legacy Memory Device

FIG. 1 also illustrates a non-legacy memory device adapted to operate with the legacy host, according to a preferred embodiment of the invention. The non-legacy memory device 100 includes a memory array 110 which is typically manufactured with a later generation memory technology providing higher capacity and reduced cost per unit storage. In the preferred embodiment, the memory array 110 is constituted from multistate memory cells, where the memory cells individually store more than one bit of data.

The memory device 100 generally has different memory architecture and characteristics than that of the legacy memory device 30. However, it is implemented to appear as if it is the legacy memory device 30 when operating with the legacy host 10. To accomplish this, it has the same host-memory device interface in the form of a complementary connector 20" that connects the set of data and control lines 21 with the legacy host. Furthermore, it has a memory controller 120 with embedded intelligence that is capable of handling the requirements of the later generation memory array 110 on the one hand and legacy interface emulation on the other hand.

The memory controller 120 includes a memory array interface 130, a host interface 140 and a memory management module 150. The memory array interface 130 interfaces between the memory array 110 and the memory management module 150. The host interface 140 interfaces between the legacy host 10 and the memory management module 150. The memory controller 120 also includes other modules such as an analog module (not shown) for controlling the necessary supply voltages and clocks.

The memory management module 150 further includes an error correction code ("ECC") module 200, a memory block management module 300 and a status bits management module 400. The ECC module 200 is employed to perform error correction operations on data retrieved from or stored to the memory array 110. The memory block management module 300 is employed to manage the storing of data in erasable blocks and its subsequent updates and garbage collections. The status bits management module 400 is employed to give status information for various states of the memory device and the host.

Figure 2:
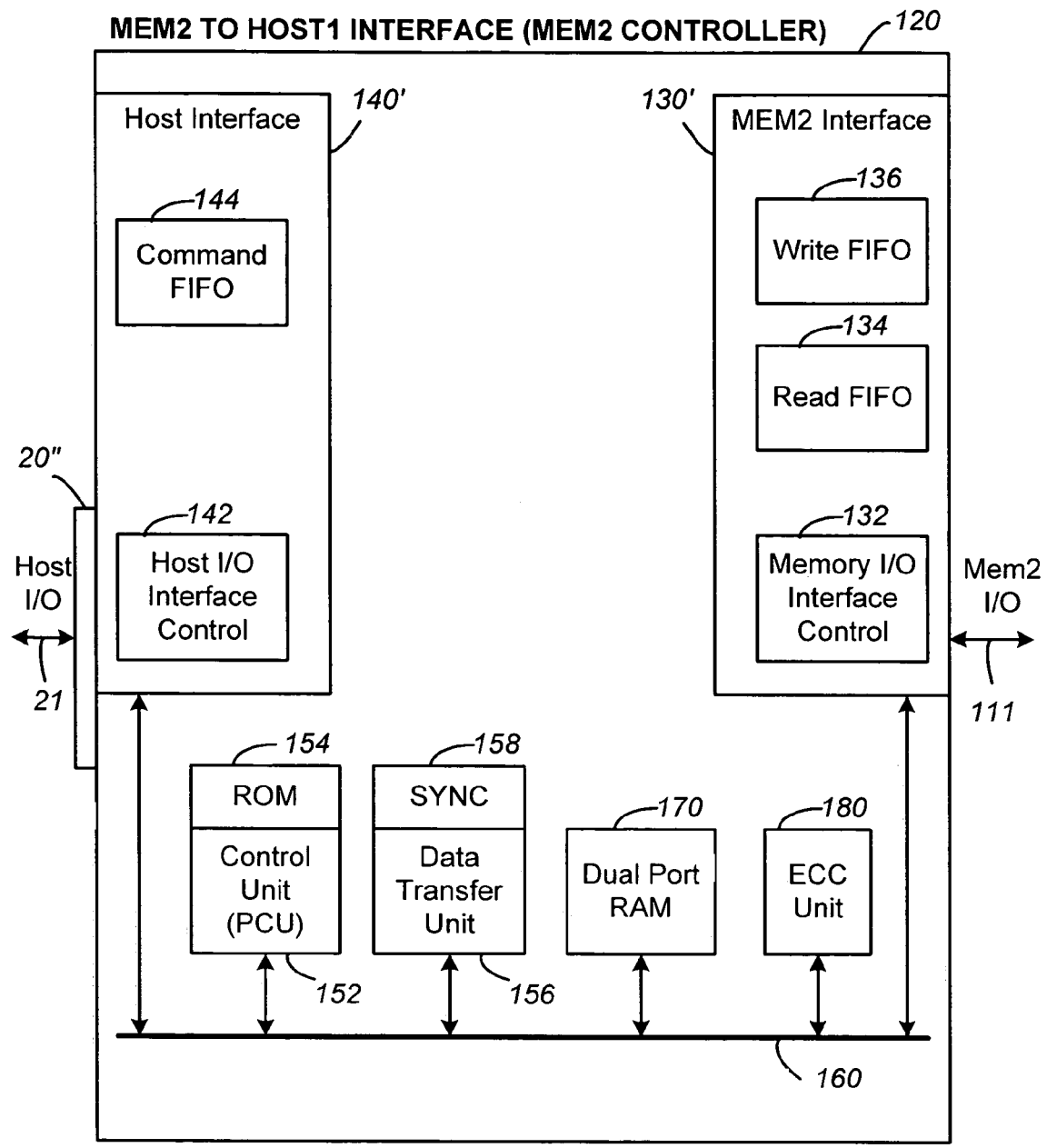
FIG. 2 illustrates the hardware components of the memory controller shown in FIG. 1.

FIG. 2 illustrates the hardware components of the memory controller shown in FIG. 1. In the preferred embodiment, the memory controller 120 has a memory array interface 130' unit, a host interface unit 140'. The memory management module 150 shown in FIG. 1 is implemented as part of a microprocessor-based system communicating through a bus 160.

The memory array interface unit 130' includes a memory I/O interface control 132, a read FIFO 134 and a write FIFO 136. The read and write FIFOs respectively serve to buffer the asynchronous read or write data transferred between the memory controller 120 and the memory array 110 via lines 111 as shown in FIG. 1. The read FIFO 134 is a queue that provides data transfer synchronization between the memory array and a DPRAM buffer in the controller (to be described below). The write FIFO 136 is a queue that provides data transfer synchronization between the DPRAM buffer and the memory array. The memory I/O interface control 132 controls the transfer between the memory array and the memory management module 150, particularly the DPRAM buffer. It also generates all control/timing signals for the memory array 110. In the preferred embodiment, it is implemented by a finite state machine.

The host interface unit 140' includes a host I/O interface control 142 and a command FIFO 144. The command FIFO 144 buffers host command received through the host-memory device interface 20" and 21 under the control of the host I/O interface control 142. The host I/O interface control also provides control to transfer between the host interface unit and the DPRAM in the memory management module 150. The host interface unit will appear to the host as if it is from a legacy memory device. It is an asynchronous interface clocked from read and write strobes supplied by the host. When the controller 120 is in low power mode, the host can begin issuing commands that will be buffered by the command FIFO 144, while the controller returns to normal operation. The host is able to issue user commands for the legacy memory device even though it is really operating with the non-legacy memory device.

The various functional units of the memory management module 150 shown in FIG. 1 are implemented by the microprocessor-based system. Intelligence is provided by a programmable control unit ("PCU") 152 executing codes stored in a read-only-memory ("ROM") 154. Data in and out of the memory controller 120 is stored in a dual port random-access-memory ("DPRAM") 170 to be processed by the PCU. A data transfer unit 156 facilitates bus transfer of data to or from the DPRAM. A synchronizer ("SYNC") 158 provides timings for the various asynchronous data transfers. An ECC unit 180 processes error correction for the data.

The PCU 152 controls the operational flow including the control signals to the data transfer unit 156. The PCU executes the necessary code data stored in the ROM 154 or in RAM to perform various tasks. These tasks include the parsing of the command FIFO 144 and the control of the various logic blocks, such as generating appropriate memory array command/address sequences, controlling data flow, performing write protection functions, servicing interrupts, performing boot sequence and performing ID/Status reads, etc. The PCU will have access to the registers within the DPRAM 170, host interface unit 140', as well as other registers and FIFO's within the memory controller. In the preferred embodiment, the PCU has an architecture that has separate instruction and data buses for improved efficiency.

The data transfer unit 156 is implemented as a state machine and provides many of the control signals to the memory I/O interface control 132, the ECC unit 200 and the read FIFO 134 and the write FIFO 136, controlling the actual data transfers between the data buffer and the memory array. The data transfer unit 156 is controlled by the PCU 152.

The dual port RAM (DPRAM) 170 is bi-directional and synchronous. It provides data synchronization for the host's Write/Read Enable clocks. It provides storage for intermediate page data of ECC processing, storage of device ID data, and storage of device status data. It also serves as a scratch pad for PCU data.

The ECC unit 200 is typically Reed-Solomon processing logic that typically includes an encoder, decoder and correction logic. In the preferred embodiment, the encoder generates 10 byte parity data. The decoder detects errors and the correction logic corrects data in the DPRAM buffer 170. Encoding, decoding and correction operations are performed under the control of the PCU 152 and the data transfer unit 156.

Error Correction of the Memory Device When Operating with the Legacy Host

According to one aspect of the invention, a non-legacy memory device is adapted to operate with a legacy host originally designed to handle error correction for a legacy memory device which is different from that of the non-legacy memory device. This is accomplished by providing a memory controller with the non-legacy memory device to process the ECC (error correction code) appropriate for the non-legacy memory device and then compute a legacy ECC to present to the host. In this way, the error correction for the non-legacy memory device is taken care of while no modifications need be made at the host.

As described above, the legacy host 10 is designed to operate with the legacy memory device 30. The legacy memory device 30 is typically a memory that supports storing one bit of data per memory cell and therefore require simple or no error correction.

Figure 3:
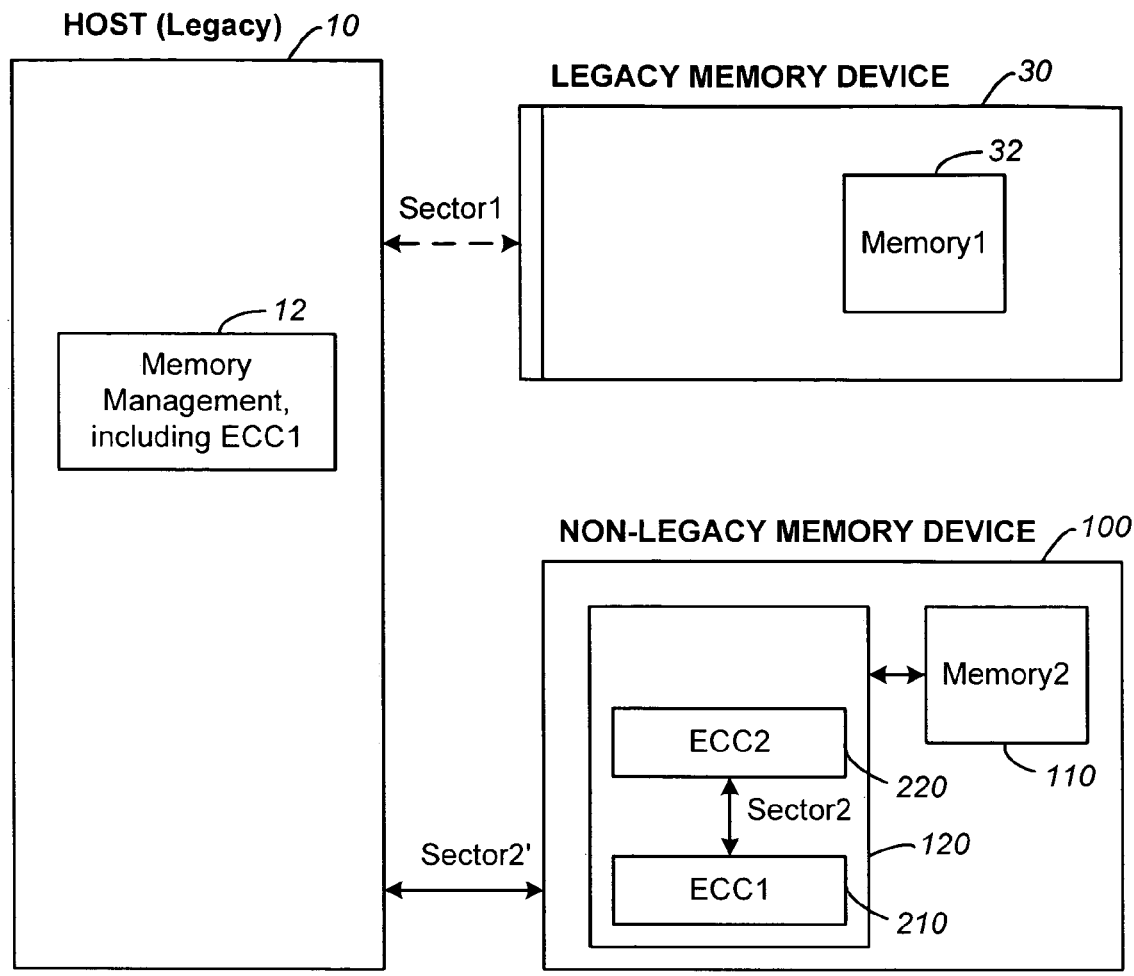
FIG. 3 illustrates the ECC module provided by the controller to serve the non-legacy memory device while at the same time satisfying the legacy host originally designed to operate with a legacy memory device.

FIG. 3 illustrates the ECC module provided by the controller to serve the non-legacy memory device while at the same time satisfying the legacy host originally designed to operate with a legacy memory device. As described above, the host 10 has the embedded memory controller 12, usually implemented as software driver that controls the legacy memory device 30. When the legacy memory device does not require error correction, the host will not be designed with ECC capabilities. When the legacy memory device does require error correction, it will usually be relatively simple, sufficient to correct single bit errors. In that case, the ECC computation is adequately handled by the software memory controller 12.

However, in a non-legacy memory device 100, such as one supporting more than one bit per memory cell, a more sophisticated and complex error correction will be required. It will be incompatible with the original ECC, if any, built into the host 10 original designed for the legacy memory device 30.

As shown in FIG. 1, the non-legacy memory device 100 includes the memory controller 120 that has an ECC module 200. The ECC module 200 comprises a legacy memory device ECC component 210 and a non-legacy memory device ECC component 220. The non-legacy memory device ECC component 220 is preferably a hardware ECC unit as in the ECC unit 180 shown in FIG. 2. The legacy memory device ECC component 210 can be implemented as a software processor by the combination of codes in ROM 154 and the PCU 152.

Figure 4A:
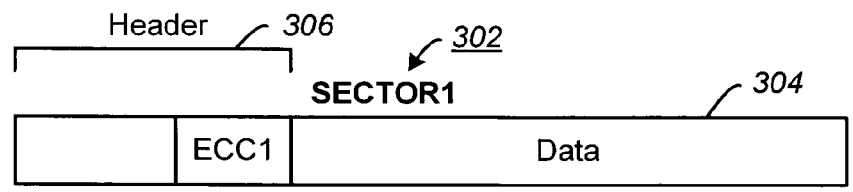
FIG. 4A illustrates the ECC in the header of a logical sector that would normally be exchanged between the host and the legacy memory device.

FIG. 4A illustrates the ECC in the header of a logical sector that would normally be exchanged between the host and the legacy memory device. The logical sector 302 comprises a data portion 304 for storing user data and a header or overhead portion 306 for storing system information. When the data portion of the sector is written, an error correction code ECC1 would be computed by the legacy controller 12 in the host and would be stored in the header portion of the sector. When the data portion of the sector is read from the legacy memory 32, the ECC1 from the header would be matched with an ECC1' computed from the data. If there is a mismatch, the stored ECC1 would be used to correct the retrieved data.

Figure 4B:
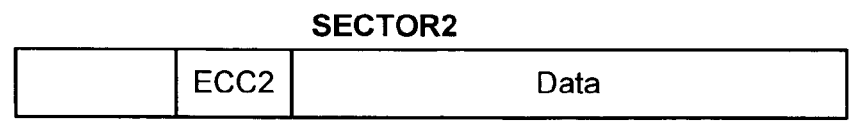
FIG. 4B illustrates the ECC in the header of a logical sector that would normally be exchanged between the host and the non-legacy memory device.

FIG. 4B illustrates the ECC in the header of a logical sector that would normally be exchanged between the host and the non-legacy memory device. In this case, the invention calls for the non-legacy memory device ECC component 220 (shown in FIG. 3) to process an appropriate ECC2 and stored with the data in each sector. Similarly, the stored ECC2 will be used to detect and correct any errors in the read data. The use of the hardware ECC unit 180 (shown in FIG. 2) will ensure efficient error correction even if there are several bits to correct without having to tie up the PCU 152.

Figure 4C:
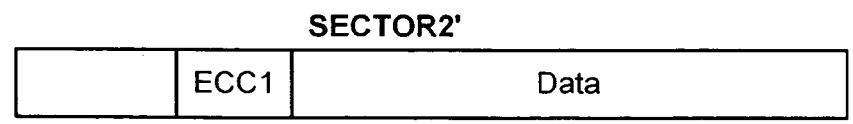
FIG. 4C illustrates the ECC in the header of a logical sector that will be exchanged between the host and the non-legacy memory device.

FIG. 4C illustrates the ECC in the header of a logical sector that will be exchanged between the host and the non-legacy memory device. In the case of a legacy host expecting to process the ECC1 from the legacy memory device, it will create an error if the ECC2 for the non-legacy memory device is presented and processed instead. The invention calls for the use of the legacy memory device ECC component 210 to compute from the data a legacy ECC1 for the host during read. As for write, the legacy ECC1 computed by the host can be ignored. The non-legacy memory device ECC component 220 will compute the appropriate ECC2 to be store with the sector data in the non-legacy memory 110.

Managing Differences between Non-Legacy and Legacy Memory Architecture

Apart from the difference in single bit and multi-bit storage, non-legacy memory devices typically have larger erasable block size for improved performance. When a non-legacy memory device is made to be compatible with a host originally designed for a legacy memory device, it must appear to the host to have a similar architecture and addressing scheme as the legacy memory device.

FIG. 5A illustrates the memory architecture and addressing scheme of a legacy memory device. The legacy memory 30 has a memory array 32 that is organized into erasable block HPB0, HPB1, . . . . For example, an erasable block may contain 32 sectors, each being about 512 bytes. As explained in connection with FIG. 1 earlier, in the interest of economy, the legacy memory device 30 is provided with only a minimum controller 34 with little or no intelligence, and relies on the host 10 to provide a controller 12 for memory management. For simplicity and expediency, the host is made to access and manage directly the physical blocks of the legacy memory device. For that reason, the entities that are communicated between the host and the memory device are referred to as "Host Physical Blocks" or ("HPB's"). A complete address is given by the HPB number and the sector offset within the HPB. The host typically has an application producing data which is packaged into files by an operating system ("OS"). As data is produced, the OS assigns them into logical sectors. The controller 12 is responsible for memory management and a logical to physical mapping module 14 maps groups of logical sectors into HPB.

FIG. 5B illustrates the organization of a logical sector 302 of the legacy memory device. Similar to that shown in FIG. 4A, the sector is partitioned into a data portion 304 and the header portion 306. In particular, the header portion contains a HPB field 308 for identifying the HPB to which this sector has been allocated.

FIG. 5C illustrates a logical block of sectors as assigned by the host and allocated to a host physical block HPB in the legacy memory 32.

FIG. 5D illustrates the logical to physical mapping between logical blocks and host physical blocks as performed by the host. As individual logical sectors are modified and deleted, the controller has to manage the task of updates and deletions of logical sectors stored within the blocks with the constraint that updates can only be made after the entire block has been erased.

Figure 6A:
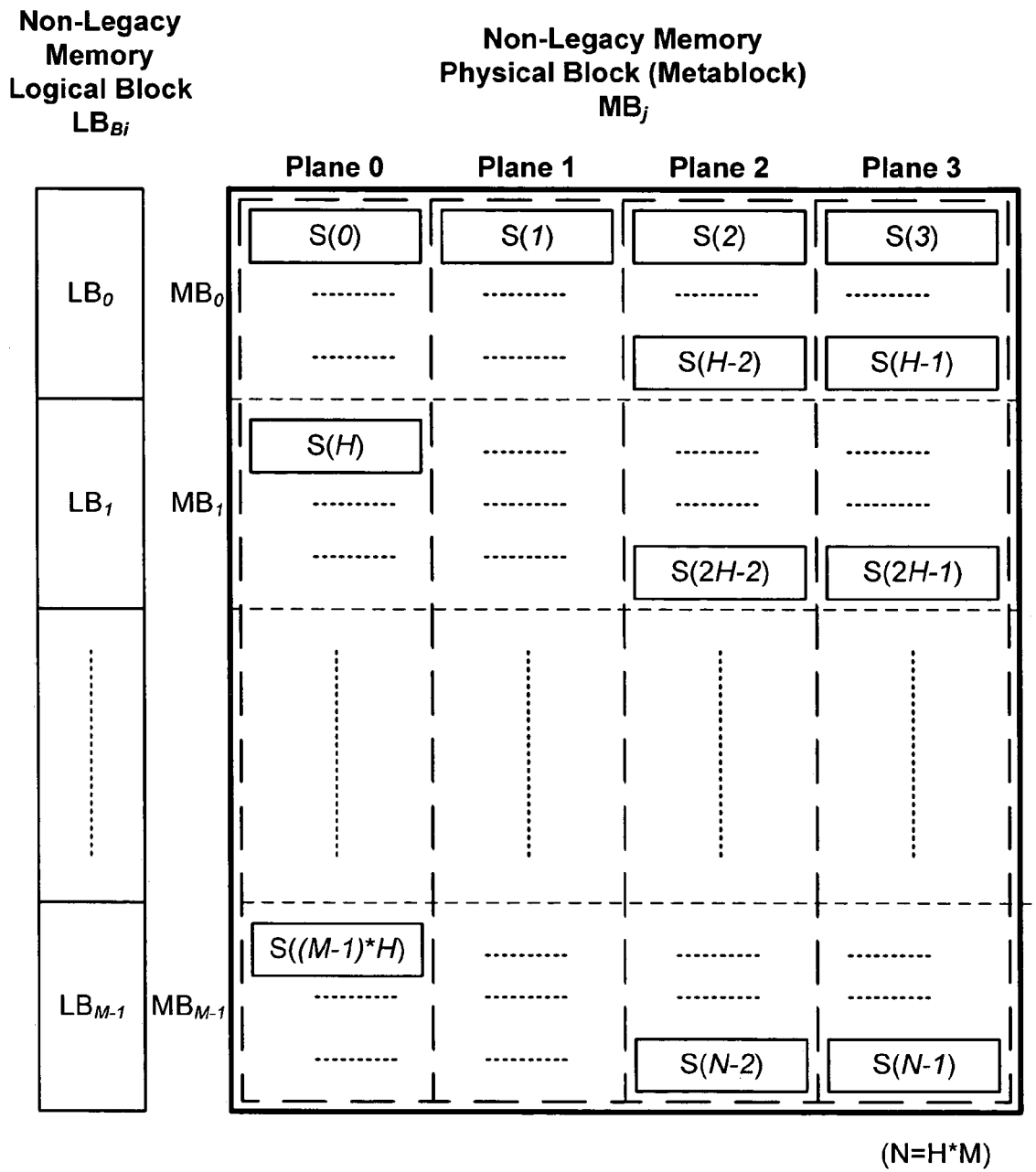
FIG. 6A illustrates the memory architecture of a non-legacy memory.

FIG. 6A illustrates the memory architecture of a non-legacy memory. The memory is partitioned into erasable blocks $MB_0$, $MB_1$, . . . which will be referred to as "metablocks". Each metablock contains H sectors. Thus, $MB_0$ contains sectors S(0), S(1), . . . , S(H-1). For example, each metablock may contain 256 sectors, which is eight times larger than the legacy memory block. In general, a metablock is preferably constituted from sectors belonging to different planes, where the sectors from each plane are operable in parallel. In this way, maximum parallelism is achieved. In order to manage updates and deletions, logical blocks LB are mapped to metablocks MB.

Figure 6B:
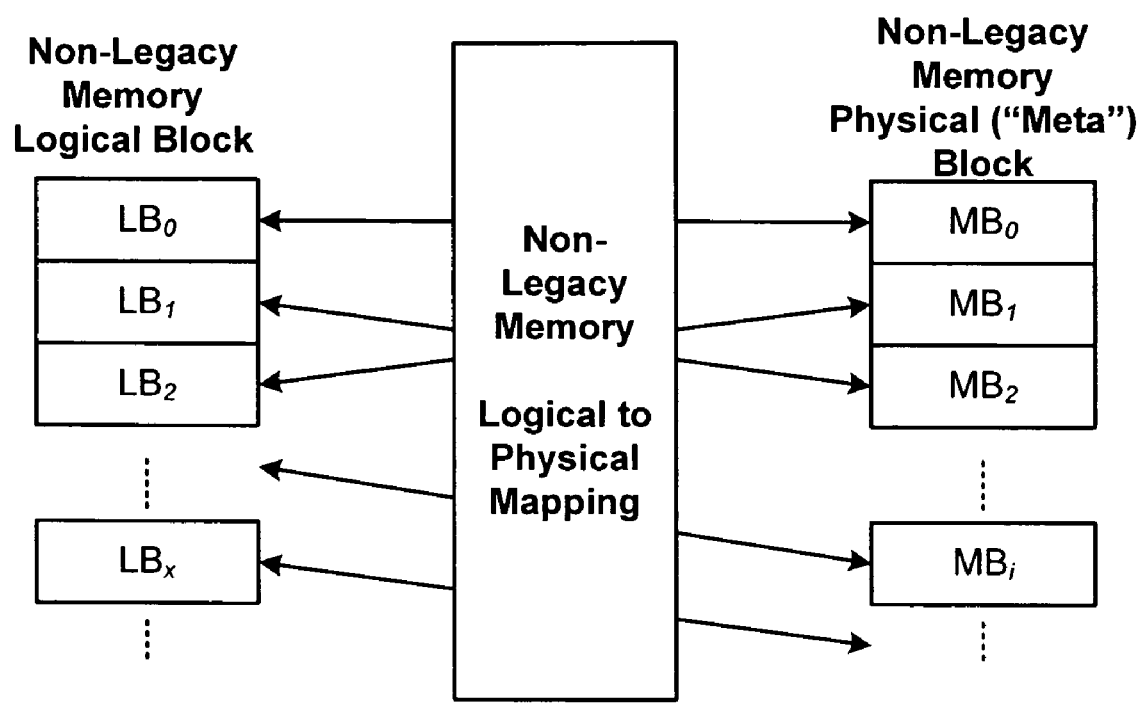
FIG. 6B illustrates a logical block to metablock mapping that is performed by the controller of the non-legacy memory device.

FIG. 6B illustrates a logical block to metablock mapping that is performed by the controller of the non-legacy memory device. In this way, the system can keep track of the data in the logical blocks even if their physical locations have changed.

Figure 6C:
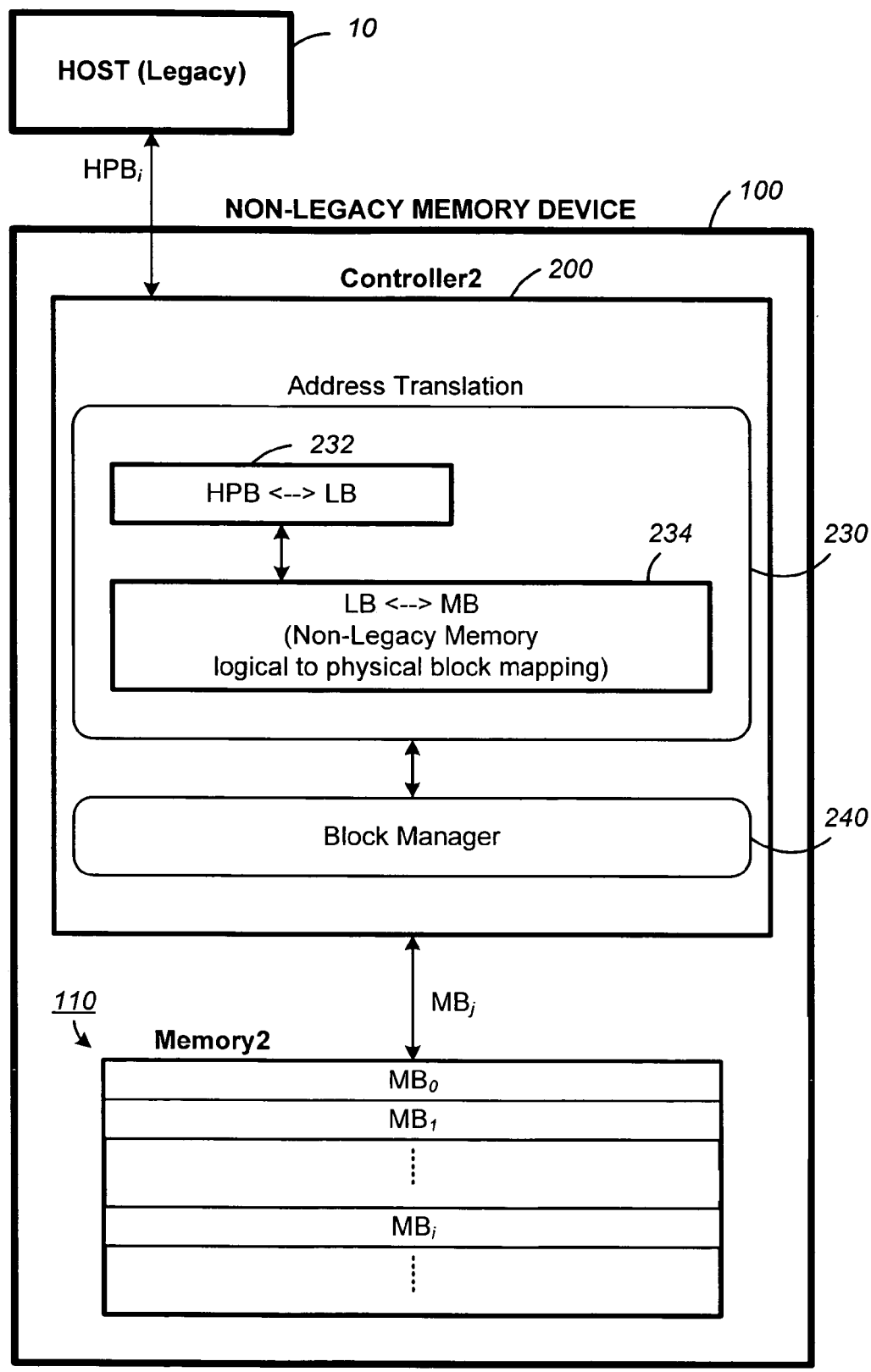
FIG. 6C illustrates the address translation performed by the controller of the non-legacy memory device in order to be compatible with the legacy host.

FIG. 6C illustrates the address translation performed by the controller of the non-legacy memory device in order to be compatible with the legacy host. As described earlier, the legacy host 10 is designed to operate with a legacy memory device 30 and exchange addresses in host physical block, HPB. The controller 200 of the non-legacy memory device 100 includes an address translation component 230 that translates the HPB addresses to Metablock addresses and a block manager 240 to manage the mapping of the logical LB to physical MB blocks. Coming from the host side, the address translation component 230 receives host physical blocks HPB from the host and packages them into units of logical blocks for storage into metablocks. In the non-legacy memory controller 200 the HPB addresses are treated as logical addresses and are assigned to fill logical blocks by a logical to logical mapping and maintained in a HPB to LB mapping table 232. A logical block LB to physical MB block mapping links a logical block to a particular metablock in storage and maintains their linkage in a LB to MB mapping table 234.

Subsequently management of the metablock relative to the logical block is handled by the block manager 240. A number of block management schemes are known in the art. A preferred one being disclosed in United States Patent Publication No. US-2005-0144360-A, entitled "Non-Volatile Memory and Method with Block Management System". The entire disclosure of the referenced publication is hereby incorporated herein by reference.

Special Legacy Status Handling

According to another aspect of the invention, status information that the legacy host expects to update on the header of a sector is instead maintained and updated in a table stored with the non-legacy memory device's controller. In this way, compatibility with the legacy host is maintained even when the non-legacy memory device does not support partial overwrites as described below.

Figure 7:
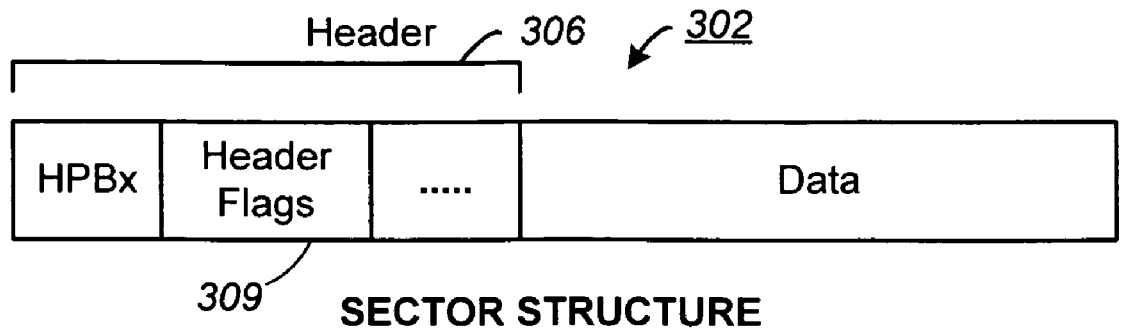
FIG. 7 illustrates the header of a sector in the legacy memory device that contains header flags for indicating status.

FIG. 7 illustrates the header of a sector in the legacy memory device that contains header flags for indicating status. For the legacy memory device 30, the header flags field 309 in the header 306 is used to store status information. Furthermore, the bits in the status field 309 may be overwritten, so a bit in the field indicates one state before it is set and indicates another state after it has been set. That is, individual bits can be re-written from a "1" to a "0" even after the original write.

However, the non-legacy memory device 100 may not support the overwrite feature as re-writes to memory can cause memory corruption in some devices. This is especially relevant to multi-level memory devices where individual memory cells may have one of multiple threshold levels programmed therein. The need to resolve more than one level per cells allows less margin for error. Thus, these memories may not be able to tolerate a second pass on programming selected bits of a byte or sector because of the resulting program disturb on existing programmed bits. In those cases where the overwrite feature is not supported, to maintain compatibility with the legacy host 10, the overhead bits are simulated.

Figure 8:
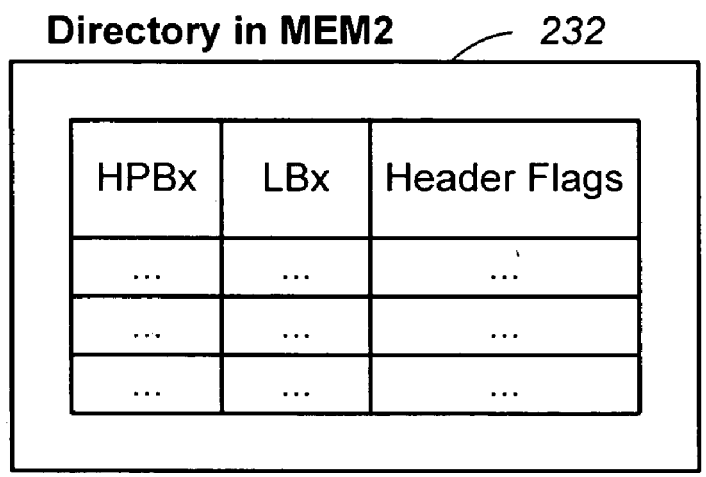
FIG. 8 illustrates maintaining the overwrite status bits in a table in the controller.

FIG. 8 illustrates maintaining the overwrite status bits in a table in the controller. The HPB to LB mapping table 232 maintained in the controller 200 (see FIG. 6C) is employed to save the header flags. During each host sector write operation the host will send a header and sector data. All headers for the 32 sectors (using the example given earlier) will contain the same LB (logical block) number for the same HPB (host physical block). This linking is saved to the HPB to LB table 232 for use during future read commands. When the controller allocates the LB number to a metablock this mapping is saved in the LB to MB table 234 (see FIG. 6C). If the host controller 12 decides to overwrite a header in the HPB this information will be saved into the HPB to LB table 232 rather than into the header 309 on the media that cannot be overwritten.

For example, an Update Status bit will be set (active) for sectors of any original host block during a copy operation (write update within the block) until the host erases that block. This state is then stored in the HPB to LB table 232 during the update operation. This state must be returned correctly after power up when the host reads the header for this HPB so the table is written to the media. When the update operation is complete the host block is erased and the table entry can be cleared.

Another example is a 2-bit Page status. These bits are used to indicate that all is OK (=3), a sector has gone bad (=1) or contains corrupted data copied from a bad sector (=0). When an erase is issued to a block with a bad page (=1) the entire block is marked bad (=1) instead of erased. On a copy operation to a new block, any sector marked bad (=1) will have its page status set to 0 in the new block. The page flag can be simulated by saving the flag values to the HPB to LB table.

Yet another example is a Block status bit that indicates that a block contains a grown defect and is no longer in use. The overwrite bits can be simulated by marking the HPB to LB table for this block and adding the actual block to a defect list.

Although the various aspects of the present invention have been described with respect to certain embodiments, it is understood that the invention is entitled to protection within the full scope of the appended claims.

It is claimed:

1. A method of adapting a memory device having a first set of memory and communication characteristics to operate with a host that was originally designed to operate with a legacy memory device having a second set of memory and communication characteristics different from said first set, said method comprising:
   providing an interfacing circuit between said memory device and said host;
   interfacing said memory device having the first set of memory and communication characteristics with said host operating with said second set of memory and communication characteristics; and
   wherein said interfacing resolves at least one difference that exists between the first and second sets of memory and their communication characteristics, said at least one difference selected from the group consisting essentially of error correction code, memory block size, number of bits stored in each memory cell and status information; and
   said at least one difference includes a status bit indicating a memory operating condition among said first set of operating characteristics; and
   said interface includes:
     providing a directory in said memory device; and
     storing one or an alternative state of said status bit in said directory responsive to the presence or absence of said memory operating condition.

2. The method as in claim 1, wherein:
said memory device comprises multi-bit memory cells and said legacy memory device is designed to operate the legacy memory device having single-bit memory cells.

3. The method as in claim 1, wherein:
said at least one difference includes erasable memory block size where said memory device has a memory block size different than that compatible with said legacy memory device with which the host was originally designed to operate, and
said interfacing mapping between the memory blocks of the memory device and that compatible with said legacy memory device.

4. The method as in claim 3, wherein:
said memory block size of said memory device is larger than that compatible with the legacy memory device.

5. The method as in claim 1, wherein:
said interfacing between said memory device and said host is asynchronous.

* * * * *